(12) United States Patent
Tsuzaki

(10) Patent No.: US 9,231,229 B2
(45) Date of Patent: Jan. 5, 2016

(54) LIGHT EMITTING PANEL AND MANUFACTURING METHOD OF LIGHT EMITTING PANEL

(71) Applicant: TOSHIBA LIGHTING AND TECHNOLOGY CORPORATION, Kanagawa (JP)

(72) Inventor: Osamu Tsuzaki, Kanagawa-ken (JP)

(73) Assignee: Toshiba Lighting & Technology Corporation, Yokosuka-shi, Kanagawa (JP)

( * ) Notice: Subject to any disclaimer, the term of this patent is extended or adjusted under 35 U.S.C. 154(b) by 0 days.

(21) Appl. No.: 14/398,606

(22) PCT Filed: May 30, 2013

(86) PCT No.: PCT/JP2013/003427
§ 371 (c)(1),
(2) Date: Nov. 3, 2014

(87) PCT Pub. No.: WO2013/190781
PCT Pub. Date: Dec. 27, 2013

(65) Prior Publication Data
US 2015/0102309 A1    Apr. 16, 2015

(30) Foreign Application Priority Data

Jun. 22, 2012    (JP) ................ 2012-140743

(51) Int. Cl.
*H01L 29/18*    (2006.01)
*H01L 51/52*    (2006.01)
*H05B 33/22*    (2006.01)
*H05B 33/28*    (2006.01)

(52) U.S. Cl.
CPC ............ *H01L 51/5218* (2013.01); *H01L 51/52* (2013.01); *H01L 51/5234* (2013.01); *H01L 51/5237* (2013.01); *H01L 51/5271* (2013.01); *H05B 33/22* (2013.01); *H05B 33/28* (2013.01); *H01L 2251/5315* (2013.01); *H01L 2251/5361* (2013.01); *H01L 2251/5392* (2013.01); *H01L 2251/558* (2013.01)

(58) Field of Classification Search
None
See application file for complete search history.

(56) References Cited

FOREIGN PATENT DOCUMENTS

| JP | H11-329745 | 11/1999 |
|---|---|---|
| JP | 2002-198168 | 7/2002 |
| JP | 2005-004188 | 1/2005 |
| JP | 2010-512643 | 4/2010 |
| JP | 2001-332392 | 11/2011 |
| JP | 2011-249541 | 12/2011 |

*Primary Examiner* — Reema Patel
(74) *Attorney, Agent, or Firm* — Ulmer & Berne LLP

(57) ABSTRACT

In the present invention, a light emitting panel has a transmissive light emitting region comprising a light emission section for emitting light and a light transmitting section for transmitting light. The light emission section of the transmissive light emitting region has a light emitting part that emits light and a conductive reflective layer that blocks and reflects light. The light emitting part of the transmissive light emitting region has the following: a first electrode layer that is electrically connected to one surface of the reflective layer and that is conductive and light transmissive; a second electrode layer that is disposed facing the first electrode layer and that is conductive and light transmissive; and an organic EL layer interposed between the second electrode layer and the first electrode layer. The light transmitting section of the transmissive light emitting region has a first electrode layer that is not in the position of the reflective layer, a second electrode layer, and an organic EL layer. In the space between the first electrode layer and organic EL layer of the light transmitting section of the transmissive light emitting region, an insulative and light transmissive resin layer is filled thereinto.

8 Claims, 6 Drawing Sheets

IIc - IId

IIe - IIf

LIGHT EMITTING PANEL AND MANUFACTURING METHOD OF LIGHT EMITTING PANEL

TECHNICAL FIELD

The present invention relates to a light emitting panel and a manufacturing method of a light emitting panel.

BACKGROUND ART

As a light emitting panel using an organic Electro-Luminescence (EL) element, a light emitting panel in which a plurality of light emitting portions and a plurality of light transmitting portions are formed between upper and lower transparent electrodes has been known. The light emitting panel is able to be used as a window for transmitting light when the light emitting portion is in a non-lighting state, and is able to be used as an illumination device when the light emitting portion is in a lighting state. Accordingly, a usage in which the light emitting panel is used as a window for daylight during daytime and is used as an illumination device during nighttime or the like has been known.

In such a light emitting panel, the light transmitting portion excluding the light emitting portion in a space between the upper and lower transparent electrodes is a space where nothing exists. Accordingly, for example, the lower transparent electrode is able to be directly formed on one light transmissive substrate.

However, since the light transmitting portion and the light emitting portion are non-planar, it is difficult for the upper transparent electrode to be directly formed on the organic EL layer. For this reason, the upper transparent electrode is formed on the other light transmissive substrate in advance, and a separate process for forming the organic EL layer thereon is necessary. Then, a process for bonding the organic EL layer in a state of being sandwiched between the upper and lower transparent electrodes is necessary, and thus complexity in manufacturing increases, and mass productivity deteriorates.

CITATION LIST

Patent Literature

[PTL 1] JP-A-2011-249541

SUMMARY OF INVENTION

Technical Problem

The present invention is to provide a light emitting panel having a structure with excellent mass productivity.

Solution to Problem

A light emitting panel of an embodiment is provided with a transmissive light emitting region which emits and transmits light, in which the transmissive light emitting region includes a light emitting portion for emitting light, and a light transmitting portion for transmitting light, the light emitting portion includes a light emitting portion for emitting light, and a conductive reflective layer for blocking and reflecting light, the light emitting portion includes a first electrode layer which is electrically connected to one surface of the reflective layer and is conductive and light transmissive, a second electrode layer which is arranged to face the first electrode layer and is conductive and light transmissive, and an organic EL layer between the second electrode layer and the first electrode layer, the light transmitting portion includes the first electrode layer on which the reflective layer is not positioned, the second electrode layer, and the organic EL layer, and a space between the first electrode layer and the organic EL layer of the light transmitting portion is filled with an insulative and light transmissive resin layer.

DESCRIPTION OF EMBODIMENTS

Figure 1:
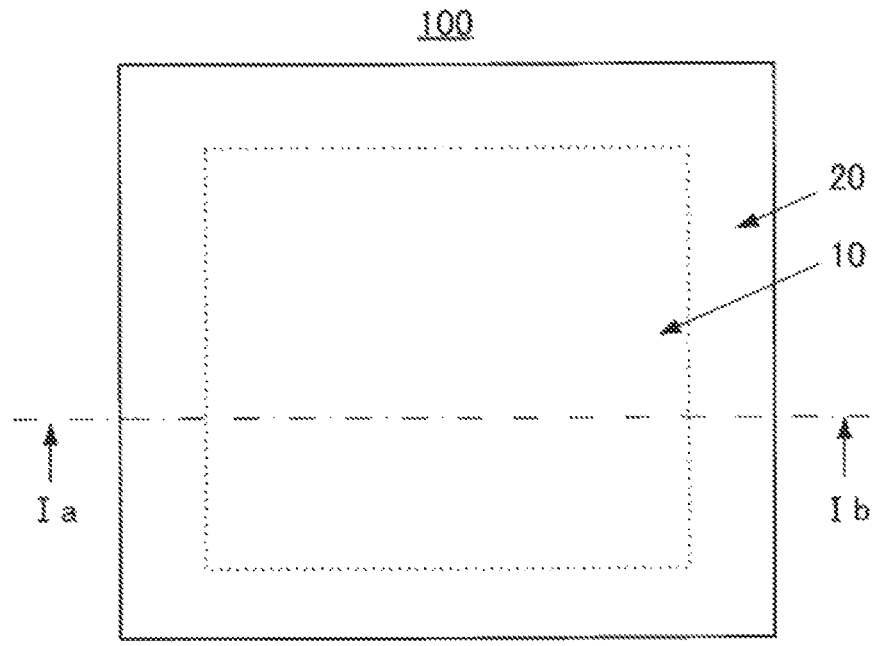
FIG. 1 is a conceptual diagram illustrating a planar configuration of a light emitting panel according to an embodiment of the invention.

Hereinafter, embodiments will be described in detail with reference to the drawings. Furthermore, in the drawings described below, components having the same functions are represented by the same reference numerals, and description thereof will not be repeated.

Figure 2:
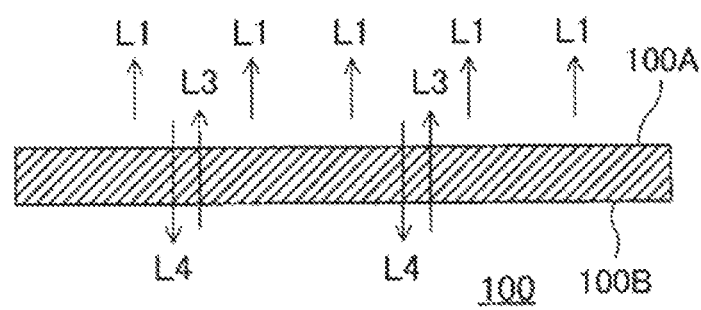
FIG. 2 is a schematic view illustrating an example of a cross-sectional surface taken along line Ia-Ib of FIG. 1.

With reference to FIG. 1 and FIG. 2, a principle of the light emitting panel used in this embodiment will be described. FIG. 1 is a conceptual diagram illustrating a planar configuration. FIG. 2 is a schematic view illustrating an example of a cross-sectional surface taken along line Ia-Ib of FIG. 1.

A planar light emitting panel 100 illustrated in FIG. 1 includes a transmissive light emitting region 10, and a peripheral region 20 disposed around the transmissive light emitting region 10. As described in detail later, the transmissive light emitting region 10 is a region from which light is emitted and in which the light is able to be transmitted between a first main surface 100A and a second main surface 100B.

As illustrated in FIG. 2, the first main surface 100A and the second main surface 100B on both sides of the light emitting panel 100 may be in the shape of a planar plate, respectively. Alternatively, the first main surface 100A and the second main surface 100B may be non-planar.

Then, in this embodiment, the transmissive light emitting region 10 emits light from only one of the first main surface 100A and the second main surface 100B. For example, as illustrated by an arrow L1 in FIG. 2 and FIG. 3, the light is emitted from the first main surface 100A side, but the light is not substantially emitted from the second main surface 100B side. Alternatively, on the contrary to this, the light may not be substantially emitted from the first main surface 100A, and the light may be emitted from the second main surface 100B.

In addition, a part of the transmissive light emitting region 10 transmits the light. For example, as illustrated by an arrow L4 in FIG. 2, the light is able to be transmitted from the first main surface 100A side to the second main surface 100B side, and, as illustrated by an arrow L3, the light is able to be transmitted from the second main surface 100B side to the first main surface 100A side.

On the other hand, the peripheral region 20, for example, is a region in which an electrode pad, a driving circuit, and various peripheral circuits or peripheral equipments, and the like are suitably disposed. Furthermore, in this embodiment, the peripheral region 20 is not necessarily essential, and is able to be suitably omitted.

The light emitting panel 100 in FIG. 1 is illustrated as an approximately planar quadrangular shape, but this embodiment is not limited thereto. That is, a planar shape of the light emitting panel 100 is able to be various shapes such as a polygon, a circle, an oval, or the like. In addition, a planar shape of the transmissive light emitting region 10 is not limited to an approximately quadrangular shape as illustrated in FIG. 1, and is able to be various shapes such as a polygon, a circle, an oval, or the like.

First Embodiment

Figure 3:
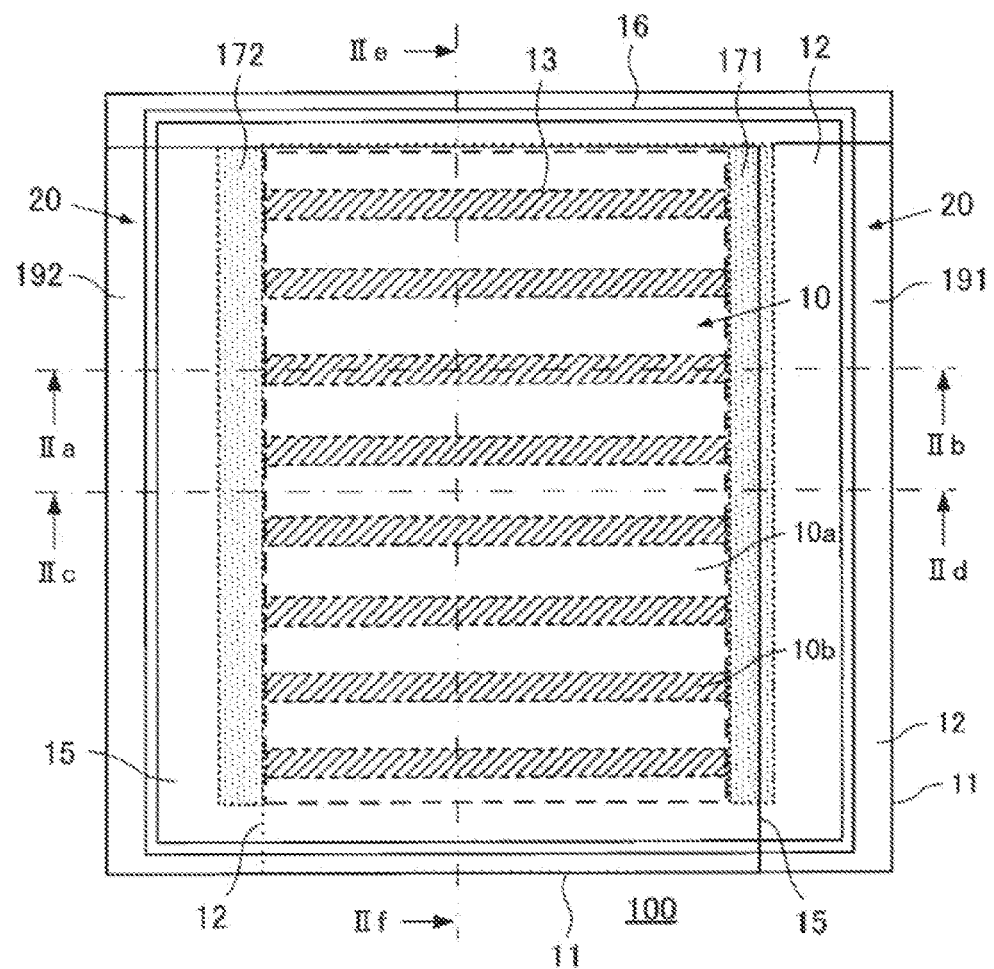
FIG. 3 is a conceptual diagram illustrating a planar configuration for describing a first embodiment of the light emitting panel.
Figure 4:
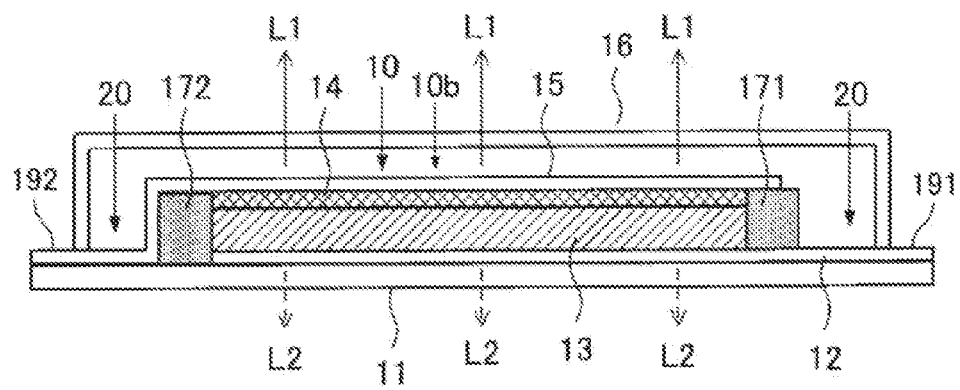
FIG. 4 is a sectional view taken along line IIa-IIb of FIG. 3.
Figure 5:
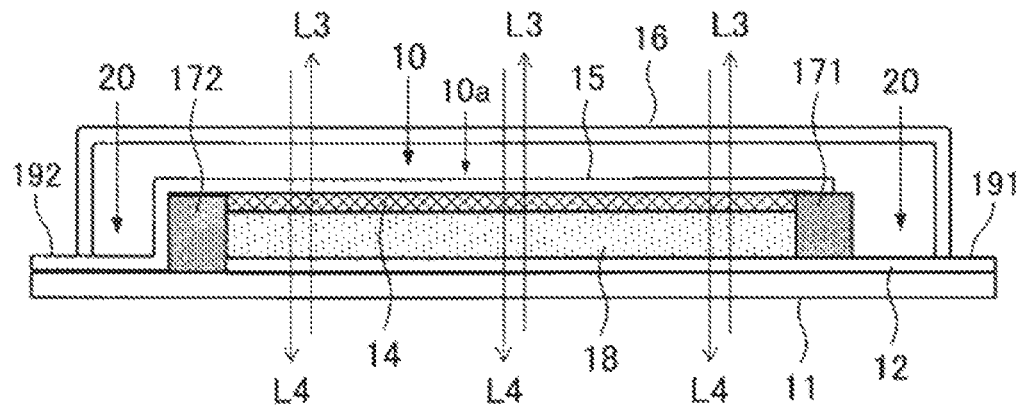
FIG. 5 is a sectional view taken along line IIc-IId of FIG. 3.
Figure 6:
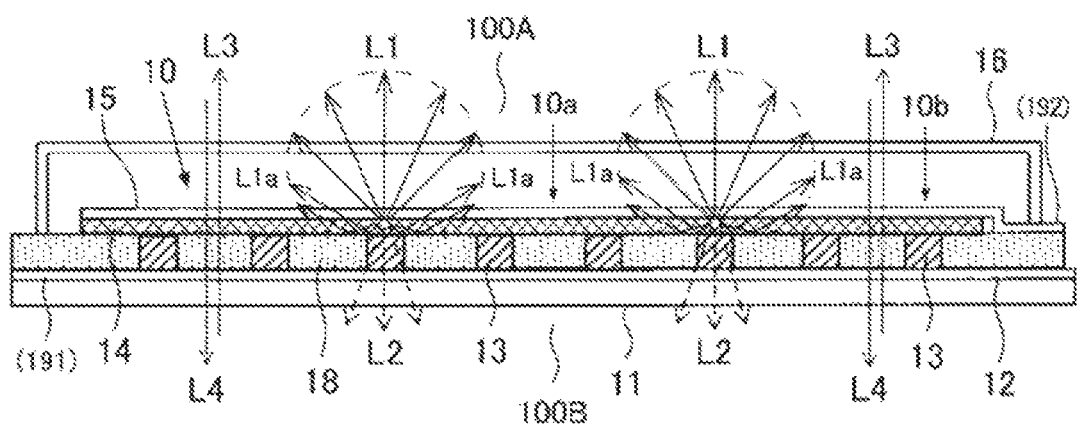
FIG. 6 is a sectional view taken along line IIe-IIf of FIG. 3.
Figure 7:
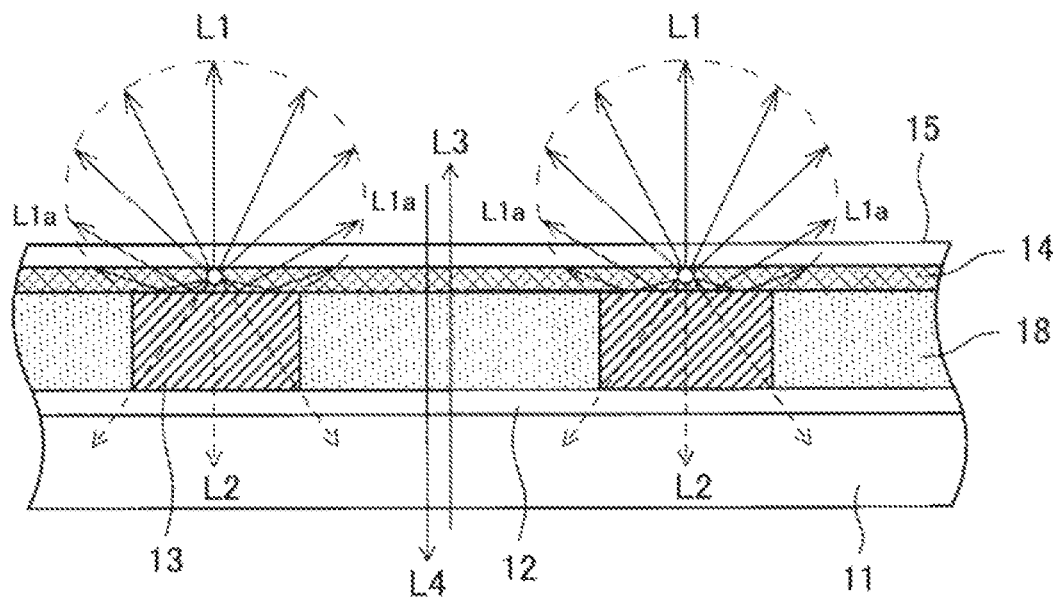
FIG. 7 is an enlarged sectional view illustrating a part of FIG. 6.

Next, with reference to FIG. 3 to FIG. 7, a first embodiment of the light emitting panel will be described. FIG. 3 is a conceptual diagram illustrating a planar configuration of a top emission type light emitting panel including an organic EL element as a light source. FIG. 4 is a sectional view taken along line IIa-IIb of FIG. 3. FIG. 5 is a sectional view taken along line IIc-IId of FIG. 3. FIG. 6 is a sectional view taken along line IIe-IIf of FIG. 3. FIG. 7 is an enlarged sectional view illustrating a part of FIG. 6.

The transmissive light emitting region 10 of the light emitting panel 100 includes a light transmitting portion 10a and a light emitting portion 10b. The transmissive light emitting region 10 is configured such that the light transmitting portion 10a and the light emitting portion 10b are alternatively disposed in the shape of a stripe. As illustrated in FIG. 6, in the transmissive light emitting region 10, the light transmitting portion 10a and the light emitting portion 10b are alternatively disposed.

The light emitting panel 100 is configured by laminating a transparent first electrode layer 12, a reflective layer 13 as a blocking layer, an organic EL layer 14 as a light emitting portion, and a transparent second electrode layer 15 on a moisture impermeable light transmissive substrate 11. Further, the light emitting panel 100 has a sealed structure due to an impermeable protective cap 16. The reflective layer 13 is formed of conductive aluminum. Accordingly, the reflective layer 13 and the first electrode layer 12 are electrically connected to each other.

As illustrated in FIG. 3 and FIG. 6, the reflective layer 13 is arranged in a position corresponding to the light emitting portion 10b. One end of the reflective layer 13 in a longitudinal direction and the second electrode layer 15 are electrically insulated by a first insulating layer 171. The other end of the reflective layer 13 in the longitudinal direction and the second electrode layer 15 are electrically insulated by a second insulating layer 172.

In the planar configuration illustrated in FIG. 3, an approximately quadrangular region sandwiched between the first and the second insulating layers 171 and 172 corresponds to the transmissive light emitting region 10, and an outer region of the first and the second insulating layers 171 and 172 corresponds to the peripheral region 20 (refer to FIG. 1).

As illustrated in FIG. 5 to FIG. 7, a space formed by being sandwiched between the first electrode layer 12 and the organic EL layer 14 is filled with an insulative and light transmissive resin layer (an insulative light transmitting layer) 18. The resin layer 18 fills side surfaces positioned on both ends of the reflective layer 13 in an arranged direction up to a side surface of the light transmissive substrate 11. The resin layer 18, for example, is able to be formed by being filled with a transparent polyimide and by curing the polyimide.

As illustrated in FIG. 6, a space between the first electrode layer 12 and the second electrode layer 15 on both sides of a plurality of reflective layers 13 in the arranged direction is filled with the resin layer 18. The resin layer 18 has the same insulation properties as the first and the second insulating layers 171 and 172 formed on both ends of the reflective layer 13 illustrated in FIG. 5 in the longitudinal direction. For this reason, the first and the second insulating layers 171 and 172 are able to be simultaneously formed at the time of being filled with the resin layer 18, and thus it is possible to simultaneously form the first and the second insulating layers 171 and 172 in a process for filling a space with the resin layer 18.

The first electrode layer 12, for example, is formed of an Indium Tin Oxide (ITO) with a thickness of 150 nm. The first electrode layer 12 is able to be formed on the planar light transmissive substrate 11, for example, by a sputtering method or a spin coat method. In addition, the first electrode layer 12 is able to be formed of an oxide of tin, an oxide of indium and tin, or the like. The first electrode layer 12 is arranged up to an outer side of the protective cap 16, and functions as a first electrode pad 191 on one side to which electric power is supplied.

The resin layer 18 is filled in order to form the same plane as the reflective layer 13. For this reason, the organic EL layer 14, for example, is able to form a uniform thickness by using a vacuum vapor deposition method.

The second electrode layer 15 laminated on the organic EL layer 14, for example, is formed of an Indium Tin Oxide (ITO) with a thickness of 150 nm. The second electrode layer 15 is able to be formed on the planar organic EL layer 14, for example, by a sputtering method or a spin coat method. In addition, the second electrode layer 15 is able to be formed of an oxide of tin, an oxide of indium and tin, or the like.

One end of the second electrode layer 15 is arranged along an upper surface of the first insulating layer 171, and the other end of the second electrode layer 15 is arranged along an upper surface and a side surface of the second insulating layer 172, and the light transmissive substrate 11 up to an outer side of the protective cap 16. The second electrode layer 15 arranged on the outer side of the protective cap 16 functions as a second electrode pad 192 on the other side to which electric power is supplied.

Furthermore, any one of the first and the second electrode pads 191 and 192 is pulled around the other, and thus it is possible to include an electrode for supplying electric power on a common side of the light emitting panel 100. In this case, it is possible to reduce routing of wiring.

The second electrode pad 192 is formed at a height lower than that of the second electrode layer 15. A difference between the heights is approximately hundreds of μm at most. Furthermore, the second electrode pad 192 on a lower side is arranged on an outer side from the second electrode layer 15. Accordingly, the second electrode pad 192, for example, is able to be simultaneously formed with the second electrode layer 15 by a sputtering method or a spin coat method.

The light transmissive substrate 11, for example, is able to be formed of various materials such as glasses, quartzes, plastics, and resins. In addition, the light transmissive substrate 11 may have any light transmissivity excluding zero, and may be colorless transparent, colored transparent, translucent, and opaque.

The light emitting portion is not limited to the organic EL layer 14, and for example, a Light Emitting Diode (LED), a Laser Diode (LD), an inorganic EL, and the like may be used.

According to a configuration illustrated in FIG. 6, when electric power is supplied to the first electrode pad 191 and the second electrode pad 192, it is possible to allow the organic EL layer 14 to emit light. As illustrated in FIG. 4, the electric power supplied to the first electrode pad 191 is supplied to one surface of the organic EL layer 14 through the first electrode layer 12 and the reflective layer 13. The electric power supplied to the second electrode pad 192 is supplied to the other surface of the organic EL layer 14 through the second electrode layer 15. Accordingly, the organic EL layer 14 positioned between the reflective layer 13 and the second electrode layer 15 emits light. The light of the organic EL layer 14 is able to be emitted in an entire circumferential direction of 360 degrees. The organic EL layer 14 for emitting light corresponds to the light emitting portion 10b.

Then, as illustrated in FIG. 6, the light emitted from the organic EL layer 14 toward a side of the first main surface 100A of the light emitting panel is emitted from the first main surface 100A. On the other hand, the light emitted from the organic EL layer 14 toward a side of the second main surface 100B of the light emitting panel is blocked by the reflective layer 13 which is the blocking layer. For this reason, the light emitted from the organic EL layer 14 is not emitted to a direction of an arrow L2. Light L1a toward the direction of the arrow L2 is reflected by the reflective layer 13 and is synthesized in a direction of an arrow L1 side, and thus fulfills a role of improving luminance.

On the other hand, the reflective layer 13 is not disposed in the light transmitting portion 10a. For this reason, as illustrated in FIG. 5, the light is able to be transmitted toward a direction of an arrow L3 through the light transmissive substrate 11, the first electrode layer 12, the resin layer 18, the organic EL layer 14, and the second electrode layer 15. In addition, the light is able to be transmitted toward a direction of an arrow L4 which is opposite to the direction of the arrow L3.

This embodiment is not limited to a specific example illustrated in FIG. 3 to FIG. 7. For example, this embodiment is not limited to a configuration in which the light emitting portions 10b (or the light transmitting portions 10a) are alternatively disposed in the shape of a stripe, and the light emitting portions 10b (or the light transmitting portions 10a) may be arranged in the shape of a matrix with an equal pitch in length and width. The light emitting portions 10b (or the light transmitting portions 10a) may be arranged in a hound's-tooth pattern, or various non-periodic arrangement patterns.

In addition, it is not necessary that planar shapes or planar sizes of a plurality of light emitting portions 10b (or a plurality of light transmitting portions 10a) are identical to each other, and the light emitting portions 10b with different planar shapes or planar sizes may be included.

In addition, area ratios of the light transmitting portion 10a and the light emitting portion 10b are not limited to an example illustrated in FIG. 3 or FIG. 6. When the area ratio of the light transmitting portion 10a increases, it is possible to increase the light quantity transmitted through the light emitting panel 100. In contrast, when the area ratio of the light emitting portion 10b increases, it is possible to increase the light quantity emitted from the light emitting panel 100. Accordingly, the area ratio is able to be suitably adjusted according to an intended purpose or a required specification, performance of the light emitting panel 100, or the like.

Thus, by forming the conductive reflective layer 13 on the first electrode layer 12, it is possible to supply electric power from the first electrode layer 12 even when the reflective layer 13 is in an independent pattern, and thus lighting in any pattern is possible. In addition, the side surface of the reflective layer 13 is filled with the resin layer 18, and thus it is possible to form an upper surface of the reflective layer 13 and an upper surface of the resin layer 18 to be the same plane.

The second electrode layer 15 formed on the reflective layer 13 and the resin layer 18 with the same plane, for example, is able to be formed by a sputtering method or a spin coat method. A thin film portion necessary for forming the second electrode layer 15, for example, is able to be formed by a method using a metal mask in the sputtering method, a method in which the thin film remains by photolithography using a mask in the spin coat method, or the like.

The resin layer 18 is formed by filling a space between the arranged reflective layers 13 with a polyimide similarly using the spin coat method, and a polyimide film is patterned by photolithography, and thus is processed into a shape in which the light transmitting portion 10a remains.

In this embodiment, by filling the light transmitting portion of a space positioned around the light emitting portion with the resin layer, it is possible to directly form the organic EL layer on the light emitting portion. Further, it is possible to directly form the second electrode on the organic EL layer. The organic EL layer and the second electrode are able to be formed during a series of processes, and thus it is possible to simplify a manufacturing process, and it is possible to improve mass productivity.

Here, a manufacturing method of the light emitting panel 100 described in the first embodiment will be described in detail.

As the moisture impermeable light transmissive substrate 11, a soda lime glass substrate (100 mm in length×100 mm in width, and a thickness=0.7 mm) is used. On a surface of the light transmissive substrate 11, an ITO is formed with a thickness of 150 nm as the first electrode layer 12 by, for example, a sputtering method.

Subsequently, as the reflective layer 13, a film with reflectivity is formed on the first electrode layer 12 by, for example, a vacuum vapor deposition method.

Here, in order to determine transmissivity of the transmissive light emitting region 10, for example, when the light emitting panel in which the area ratio of the light transmitting portion 10a is 85% is prepared, a blocking layer 32 is formed by using evaporation masks which are periodically arranged at equal intervals such that a total area of window portions of the evaporation mask is 15% of an entire area of the mask. As the reflective layer 13, an aluminum (Al) film is formed with a thickness of 400 nm.

Furthermore, the reflective layer 13 is able to be formed by a method for performing thermal transfer from arranged aluminum donor sheets illustrated in FIG. 4.

Next, in order to prevent a contact failure between an ITO film which is the first electrode layer 12 and an ITO film which is the second electrode layer 15 of the following process, the first and the second insulating layers 171 and 172 are formed. The first and the second insulating layers 171 and 172 are realized by forming a polyimide film with a thickness of approximately 1.5 μm, for example, using a spin coat method. The first and the second insulating layers 171 and 172 are processed on both ends in the longitudinal direction of the light transmitting portion 10a and the light emitting portion 10b into a shape in which the first and the second insulating layers 171 and 172 sandwich the light transmitting portion 10a and the light emitting portion 10b.

Next, the organic EL layer 14 for emitting white light with two wavelengths, for example, is formed on the ITO film by using a vacuum vapor deposition method. As the organic EL layer 14, first, an α-NPD film is formed with a thickness of 60 nm as a hole transport layer. Subsequently, as a layer emitting blue light, a film in which a host material is α-NPD (diphenyl naphthyl diamine) and a dopant material is perylene, is formed with a thickness of 20 nm such that a dopant concentration is 1 wt %. Next, as a layer for emitting red light, a film in which a host material is Alq3 [tris(8-quinolinolato)aluminum] and a dopant material is DCM1 is formed with a thickness of 40 nm such that a dopant concentration is 1 wt %. Finally, as an electron transport layer, an Alq3 film is formed with a thickness of 20 nm.

Subsequently, as the second electrode layer 15, an ITO film is formed with a thickness of 150 nm, for example, by using photolithography.

The organic EL element prepared therefor is extremely vulnerable to moisture in outside air. Therefore, the organic EL layer 14 is covered by the impermeable protective cap 16 to be hermetically sealed. In this embodiment, light transmitting properties are necessary for the light transmitting portion 10a, and thus the impermeable protective cap 16 also has the light transmitting properties.

The impermeable protective cap 16 uses a soda lime glass substrate. As a hermetic sealing method, an edge portion of the soda lime glass substrate is coated with a UV curable adhesive, and the protective cap 16 is bonded to cover the transmissive light emitting region 10. Then, an adhesive is cured by irradiating an adhesive coating portion with UV light and is hermetically adhered in a state where the organic EL layer 14 is blocked in order not to be irradiated with UV light.

In the manufacturing method of the light emitting panel, the space which is sandwiched between the first and the second electrode layers and does not include the reflective layer is filled with the resin layer. For this reason, at the time of forming the second electrode layer, the second electrode layer is able to be formed by a spin coat method, and a necessary portion is able to remain by photolithography using a mask. By using the same photolithography as in the formation of the first electrode layer, it is possible to commonalize a manufacturing system.

Second Embodiment

Figure 8:
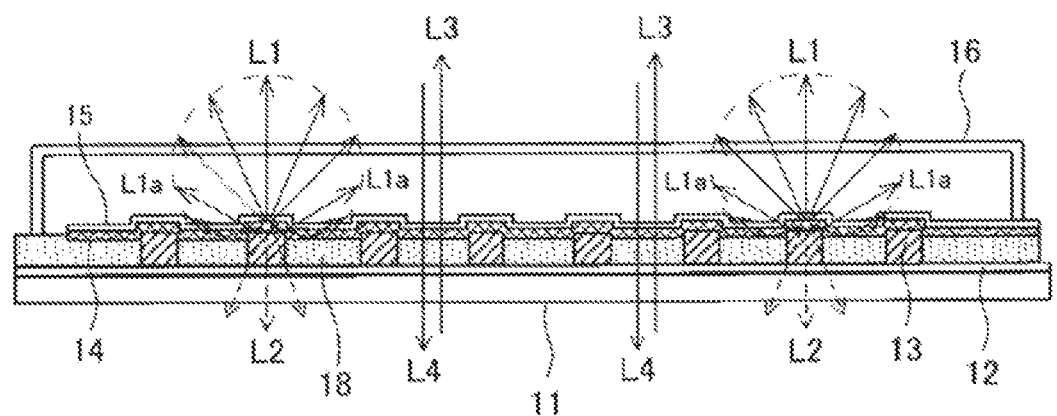
FIG. 8 is a sectional view for describing a second embodiment of the light emitting panel.
Figure 9:
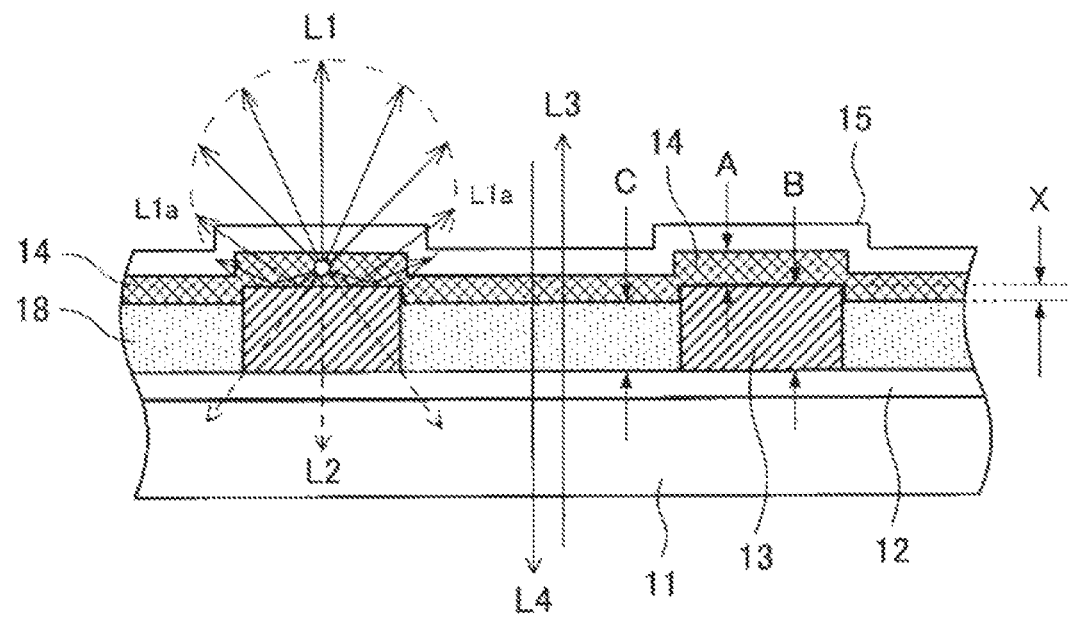
FIG. 9 is an enlarged sectional view illustrating a part of FIG. 8.

With reference to FIG. 8 and FIG. 9, a second embodiment of the light emitting panel will be described. FIG. 8 is a sectional view. FIG. 9 is an enlarged sectional view of a part of FIG. 8.

A thickness of the organic EL layer 14 is approximately 150 μm at most. For this reason, in the vicinity of a boundary between the reflective layer 13 and the resin layer 18, the second electrode layer 15 may be suspended. In this case, the second electrode layer 15 and the conductive reflective layer 13 may be short circuited. This embodiment is to prevent the second electrode layer 15 and the reflective layer 13 from being short circuited.

That is, as illustrated in FIG. 9, a thickness X is formed between the upper surface of the reflective layer 13 and the upper surface of the resin layer 18. The thickness X is a value (X=B−C) obtained by subtracting a thickness C of the resin layer 18 from a thickness B of the reflective layer 13. Then, a relationship between the thickness X and a thickness A of the organic EL layer 14 is X<A.

When the relationship between the thickness X and the thickness A of the organic EL layer 14 is X<A, it is possible to secure a sufficient distance by which the reflective layer 13 and the second electrode layer 15 are not short circuited even when the second electrode layer 15 is suspended. Accordingly, by preventing a short circuit, it is possible to prevent a lighting failure of the organic EL layer 14.

Furthermore, in this embodiment, the thickness X formed between the upper surface of the reflective layer 13 and the upper surface of the resin layer 18 is extremely thin of a micron order, and for example, it is possible to form the second electrode layer 15 by a sputtering method or a spin coat method.

In this embodiment, by preventing the short circuit between the second electrode layer and the reflective layer due to the suspended second electrode layer, the lighting failure of the organic EL layer is prevented.

Third Embodiment

Figure 10:
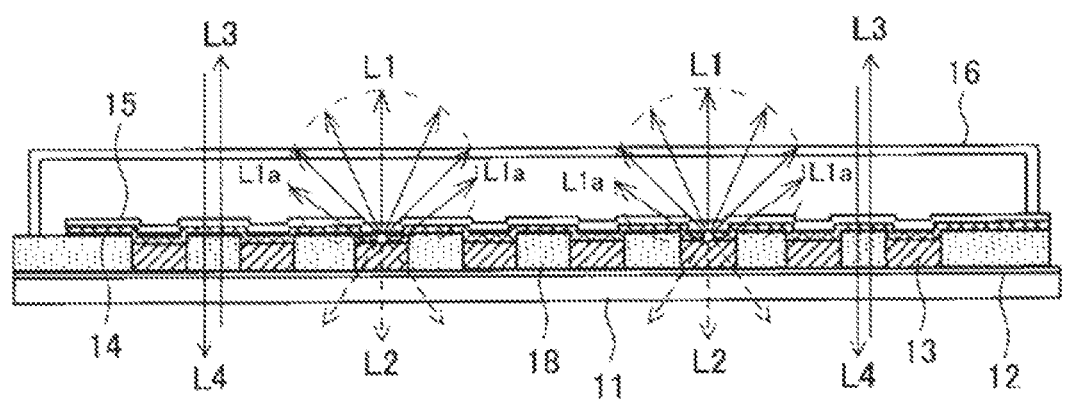
FIG. 10 is a sectional view for describing a third embodiment of the light emitting panel.
Figure 11:
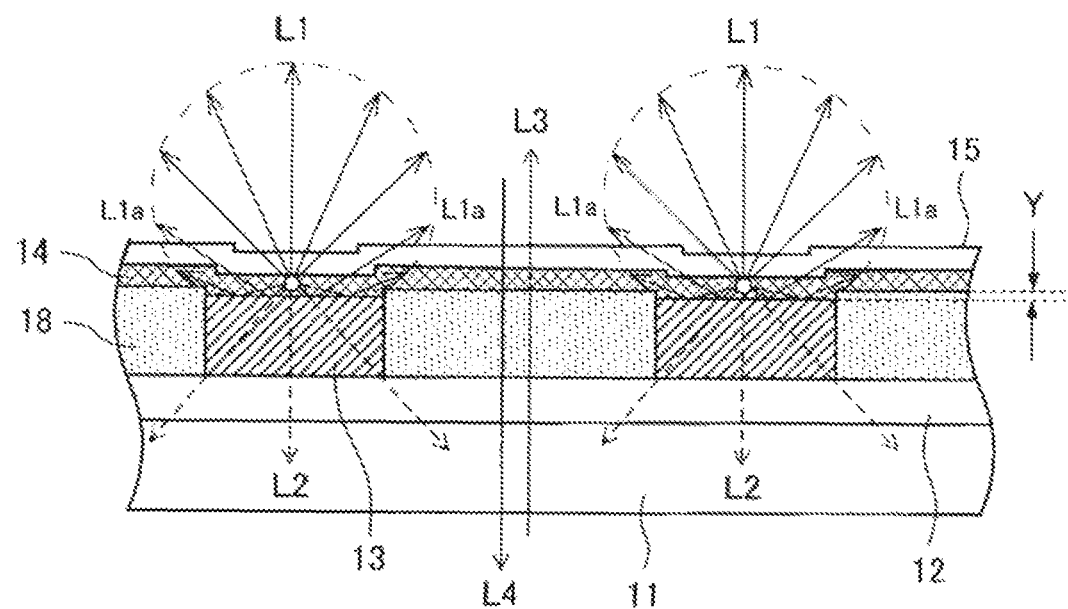
FIG. 11 is an enlarged sectional view illustrating a part of FIG. 10.

With reference to FIG. 10 and FIG. 11, a third embodiment of the light emitting panel will be described. FIG. 10 is a sectional view. FIG. 11 is an enlarged sectional view of a part of FIG. 10. Similar to the second embodiment, according to this embodiment, the short circuit between the second electrode layer 15 and the reflective layer 13 is prevented.

In this embodiment, as illustrated in FIG. 11, a height of the upper surface of the resin layer 18 is formed to have a thickness margin of Y from the upper surface of the reflective layer 13.

According to a relationship where the resin layer 18 is higher than the reflective layer 13, the second electrode layer 15 is prevented from being suspended. In addition, an interval between the second electrode layer 15 and the reflective layer 13 is widened, and thus the short circuit is prevented.

Furthermore, in this embodiment, the height of the upper surface of the resin layer 18 is formed to have the thickness margin of Y from the upper surface of the reflective layer 13, but the thickness Y is extremely thin of a micron order, and for example, it is possible to form the second electrode layer 15 by a sputtering method or a spin coat method.

In this embodiment, the second electrode layer is prevented from being suspended, and the short circuit between the second electrode layer and the reflective layer is prevented, and thus the lighting failure of the organic EL layer is prevented.

The present invention is not limited to the embodiments described above. For example, when the light transmitting portion 10a is dotted with a plurality of light emitting portions 10b, lighting may be individually performed in the respective light emitting portions 10b. This is able to be realized by, for example, a switching element such as a Thin Film Transistor (TFT). According to this, lighting is able to be performed only in a part of the transmissive light emitting region 10, and characters, graphics, image data, and the like are able to be displayed.

In addition, for example, the light emitting portion 10b for emitting light of a red color (R), the light emitting portion 10b for emitting light of a green color (G), and the light emitting portion 10b for emitting light of a blue color (B) are able to be adjacently arranged pixels, and the pixels are able to be periodically arranged in the transmissive light emitting region 10. In this case, when emission intensities of the respective pixels of the red color, the green color, and the blue color are controlled, a color display is also possible.

The transmission type light emitting panel is very useful in development of an organic EL illumination device such as in an in-vehicle field, a residential field, and an advertising field.

For example, when the transmission type light emitting panel of this embodiment is used for a vehicle window as a head up display, outside light is able to be introduced through the light emitting panel. In addition, when the light emitting panel is integrated with the window, it is possible to obtain advantages which are not able to be imitated by other in-vehicle light sources in terms of design and space.

While certain embodiments have been described, these embodiments have been presented by way of example only, and are not intended to limit the scope of the inventions. Indeed, the novel embodiments described herein may be embodied in a variety of other forms; furthermore, various omissions, substitutions, combinations, and changes in the form of the embodiments described herein may be made without departing from the spirit of the inventions. The accompanying claims and their equivalents are intended to cover such forms or modifications as would fall within the scope and spirit of the inventions.

REFERENCE SIGNS LIST 100 light emitting panel
100A first main surface
100B second main surface
10 transmissive light emitting region
20 peripheral region
10a light transmitting portion
10b light emitting portion
11 light transmissive substrate
12 first electrode layer
13 reflective layer
14 organic EL layer
15 second electrode layer
16 protective cap
171 first insulating layer
172 second insulating layer
18 resin layer
191 first electrode pad
192 second electrode pad

The invention claimed is:

1. A light emitting panel provided with a transmissive light emitting region which emits and transmits light,
wherein the transmissive light emitting region includes a light emitting portion for emitting light, and a light transmitting portion for transmitting light,
the light emitting portion includes a light emitting portion for emitting light, and a conductive reflective layer for blocking and reflecting light,
the light emitting portion includes a first electrode layer which is electrically connected to one surface of the reflective layer and is conductive and light transmissive, a second electrode layer which is arranged to face the first electrode layer and is conductive and light transmissive, and an organic EL layer between the second electrode layer and the first electrode layer,
the light transmitting portion includes the first electrode layer on which the reflective layer is not positioned, the second electrode layer, and the organic EL layer, and
a space between the first electrode layer and the organic EL layer of the light transmitting portion is filled with an insulative and light transmissive resin layer.

2. The light emitting panel according to claim 1,
wherein light toward a side of a first main surface of the light emitting panel from the light emitting portion is emitted from the first main surface, and light toward a side of a second main surface of the light emitting panel from the light emitting portion is shielded by the reflective layer.

3. The light emitting panel according to claim 1,
wherein the organic EL layer has a top emission type light emission structure.

4. The light emitting panel according to claim 2,
wherein the organic EL layer has a top emission type light emission structure.

5. The light emitting panel according to claim 1,
wherein a height of an upper surface of the reflective layer is lower than that of an upper surface of the resin layer.

6. The light emitting panel according to claim 2,
wherein a height of an upper surface of the reflective layer is lower than that of an upper surface of the resin layer.

7. The light emitting panel according to claim 3,
wherein a height of an upper surface of the reflective layer is lower than that of an upper surface of the resin layer.

8. The light emitting panel according to claim 4,
wherein a height of an upper surface of the reflective layer is lower than that of an upper surface of the resin layer.

* * * * *